United States Patent [19]
Kawai et al.

[11] Patent Number: 5,473,194
[45] Date of Patent: Dec. 5, 1995

[54] CHIP CARRIER HAVING THROUGH HOLE CONDUCTORS

[75] Inventors: Tsuneo Kawai; Takao Nakamura; Tsuyoshi Fujita; Minoru Tanaka, all of Yokohama, Japan

[73] Assignee: Hitachi, Ltd., Tokyo, Japan

[21] Appl. No.: 225,921

[22] Filed: Apr. 11, 1994

Related U.S. Application Data

[63] Continuation of Ser. No. 615,869, Nov. 20, 1990, abandoned.

[30] Foreign Application Priority Data

Nov. 24, 1989 [JP] Japan .................................... 1-303304

[51] Int. Cl.$^6$ .............................. H01L 23/02; H01L 23/48
[52] U.S. Cl. .......................... 257/774; 257/697; 257/698; 257/700
[58] Field of Search ..................... 357/71, 80, 67, 357/65, 68; 257/700, 704, 706, 713, 717, 747, 774, 701, 702, 787, 697, 698; 361/386, 400, 409, 411

[56] References Cited

U.S. PATENT DOCUMENTS

| | | | |
|---|---|---|---|
| 3,777,220 | 12/1973 | Tatusko et al. | 361/400 |
| 4,074,342 | 2/1978 | Honn et al. | 357/80 |
| 4,446,477 | 5/1984 | Currie et al. | 257/774 |
| 4,901,136 | 2/1990 | Neugebauer et al. | 357/80 |
| 4,908,689 | 3/1990 | McBride et al. | 357/80 |
| 4,954,877 | 9/1990 | Nakanishi et al. | 357/80 |
| 5,001,542 | 3/1991 | Tsukagoshi et al. | 357/67 |

*Primary Examiner*—Sara W. Crane
*Assistant Examiner*—Carl Whitehead, Jr.
*Attorney, Agent, or Firm*—Antonelli, Terry, Stout & Kraus

[57] ABSTRACT

A chip carrier has an electrically insulating substrate with through holes and a multilayer structure formed on the substrate. The multilayer structure includes an electrical conductor pattern for electrical connection with through hole conductors provided in the through holes and for electrical connection with an IC chip. The through hole conductors have their ends protruding from one surface of the substrate on which registration layers are formed for electrically interconnecting the through hole conductors and the electrical conductor pattern in the multilayer structure. The surface of the protruding end of each of the through hole conductors is generally continuously convexly curved and has a maximum height at or in the vicinity of its central portion with the height being measured from the surface of the substrate.

3 Claims, 6 Drawing Sheets

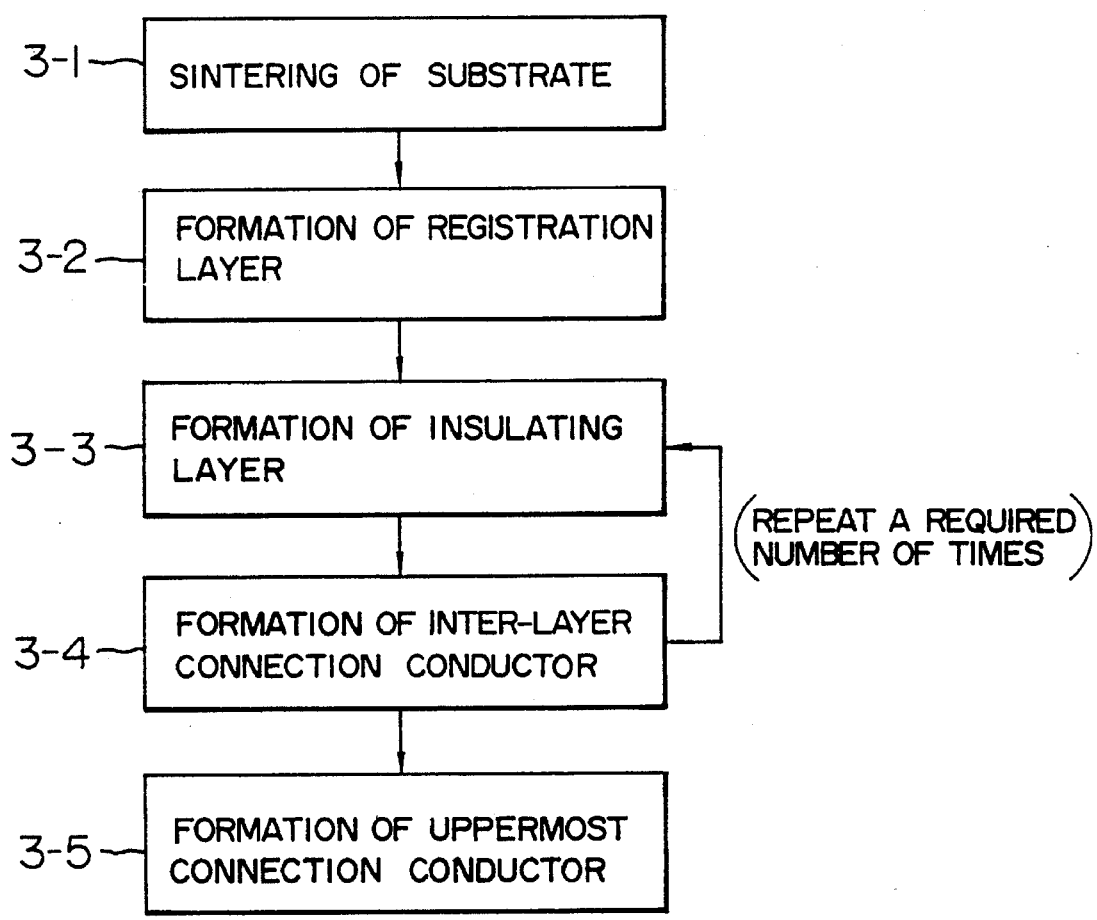

CHIP CARRIER HAVING THROUGH HOLE CONDUCTORS

This application is a Continuation application of Ser. No. 07/615,869 filed Nov. 20, 1990, which is now abandoned.

BACKGROUND OF THE INVENTION

The present invention relates to semiconductor chip carriers.

A large-sized computer, for example, may be constituted by a plurality of modules, each including a plurality of leadless chip carriers. Generally, each module has one semiconductor chip mounted thereon.

FIG. 1 schematically illustrates a computer module which includes a plurality of semiconductor chips 1 which are mounted on the corresponding leadless chip carriers 2 which are, in turn, mounted on an insulating module baseplate 3 which has an inter-layer connection conductor layer for electrical connection to the semiconductor chips.

Each leadless chip carrier 2 has, for example, a cross-sectional configuration as macroscopicaally shown in FIGS. 2A and 2B. An insulating substrate 4 made of, for example, a ceramic has one or more through holes 10 in which corresponding conductors 11 are formed by filling, by printing, an electrically conductive material made of, for example, a paste which mainly consists of tungsten and sintering the conductive material together with the substrate. A registration layer 5 made of a metal film, for example, aluminum, is formed on a surface of each of the conductors 11 in the substrate 4 (through hole conductors 11) by sputtering, vapor deposition or the like. A required number of layers of insulating films 6 and inter-layer connection conductor layers 7 are laminated sequentially on the registration layer 5. The formation of the insulating films 6 may be made, for example, by spin coating. The formation of the inter-layer connection conductor layers 7 may be made, for example, by sputtering. The semiconductor chips 1 are connected, for example, by CCB (Controlled Collapse Bonding) solder 9 on the uppermost connection conductor layer 8. Metal plating may be made on the surface of the through hole conductors 11 to improve the adhesiveness to the registration layer 5.

FIG. 3 illustrates a process for manufacturing leadless chip carriers 2. A ceramic substrate 4 in which through holes 10 filled with conductor paste 11 are formed is sintered (step 3-1), a registration layer 5 is formed (step 3-2), a required number of insulating films 5 and inter-layer connection conductor layers 7 are laminated on the registration layer 5 (steps 3-3, 3-4), and, lastly, uppermost connection conductor layer 8 is formed (step 3-5 ).

JP-A-63-19896 published Jan. 27, 1988 discloses a multilayer connection substrate which includes a ceramic multilayer connection conductor substrate having conductors formed on a surface of the substrate and in the substrate and a multilayer circuit formed on the substrate and including connection conductors connected to the former conductors.

JP-A-60-10698 published Jan. 19, 1985 discloses a multilayer connection substrate formed by polishing a surface of a ceramic substrate having through hole connection conductors therein and flattening exposed portions of the through hole connection conductors, covering the flattened surface with metal protective films, and forming a multilayer connection conductor layer which connects to the through hole connection conductors on the surface of the ceramic substrate thus obtained.

In a module which uses such a chip carrier as schematically shown in FIG. 2B, while the through hole conductors 11 mainly serve as a power supply line or a signal line, a decrease in the power source voltage for the IC circuit devices in the semiconductor chip 1, fluctuations of signals in the IC circuit devices, etc., sometime occur heretofore, suppression of such phenomena has been required.

SUMMARY OF THE INVENTION

In order to research causes of the above problems, the inventors have microscopically observed and investigated states of contact between the through hole conductors 11 and the registration layer 5 in the ceramic substrate 4 of each chip carrier 2. As a result, the following facts have been clarified.

In the conventional leadless chip carrier, as shown in FIG. 4, discontinuously irregular steps of about 10 µm at a maximum are produced between the through hole conductor 11 surface and the ceramic substrate 4 surface. Since the through hole conductors 11 are produced by print-sintering, a paste of powder having a grain size of about 3–5 µm, fine irregularities of about 3–5 µm are produced over the entire surface of the through hole conductor 11. It is obvious that the problem will arise if the registration layer 5 is formed on the irregular surface of the conductors, voids 13 and discontinuities 12 are produced, as shown in FIG. 5, so that reliability on the connection to the connection conductor layer 7 is reduced.

It is an object of the present invention to provide a high reliability chip carrier which assures electrical connection between through hole conductors provided in an insulating substrate and an electrical conductor pattern included in a multilayer structure formed on the insulating substrate.

It is another object of the present invention to provide a method of manufacturing such high reliability chip carriers.

A chip carrier has an electrically insulating substrate with through holes formed therein and a multilayer structure formed on the substrate. The multilayer structure includes an electrical conductor pattern for electrical connection with through hole conductors provided in the through holes and for electrical connection with an IC chip.

BRIEF DESCRIPTION OF THE DRAWINGS

FIG. 3 shows steps of manufacturing the conventional leadless semiconductor chip carrier.

DESCRIPTION OF THE PREFERRED EMBODIMENT

Figure 6A:
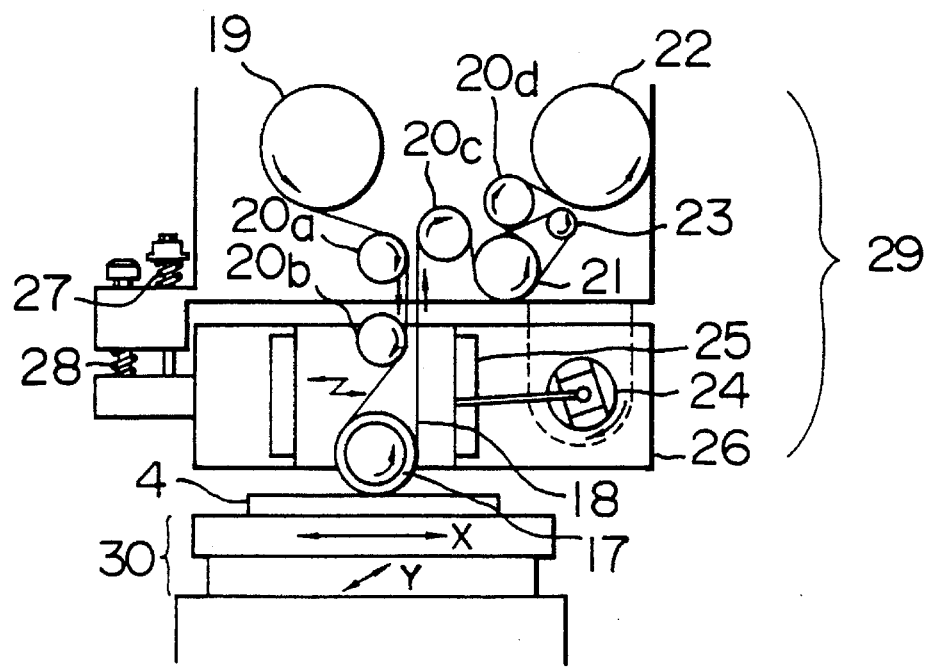
FIGS. 6A and 6B schematically illustrate an apparatus which may be employed for processing a protruding end of a through hole conductor in one embodiment of the present invention.
Figure 6B:
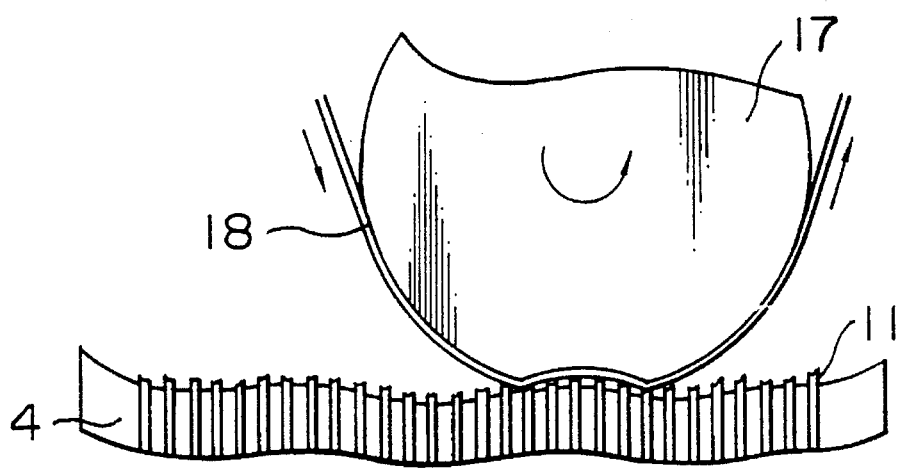

FIG. 6A illustrates an apparatus for polishing surfaces of protruding ends of through hole conductors 1 in one embodiment of the present invention. FIG. 6B is an enlarged view of the essential portion of FIG. 6A. A surface of an insulating substrate 4 of, for example, a ceramic in which one or more conductors 11 are provided is ground by pressing the surface with a polishing tape 18 coated with abrasive grains via a pressure roller 17 made of an elastic material, for example, of rubber and causing the tape to travel.

Polishing of the surfaces of the protruding ends of the through hole conductors will be described in more detail with reference to FIG. 6A. The polishing tape 18 is extended to be sequentially engaged with a tape feed reel 19, guide rollers 20a, 20b, pressure roller 17, guide roller 20c, drive roller 21, guide roller 20d and a take-up roller 22. By rotating the drive roller 21 coupled through a belt to a take-up roller motor 23, the tape 18 is gradually taken up by the tape take-up roller 22. At this time, the pressure roller 17 is vibrated in a direction perpendicular to the rotation axis of the pressure roller by a crank mechanism 24 in a plane substantially parallel to the surface of a movable table (x-y table) 30 on which the ceramic substrate 4 is mounted.

A base 26 carrying a vibrating unit 25 is, as a whole, supported at the same point as the rotation axis of a vibration motor. A spring 27 for canceling the weight of the whole base 26 and a spring 28 for applying a polishing load are provided at a location opposite to the rotation axis of the vibration motor. The pressure applied by the pressure roller 17 to the ceramic substrate 4 is adjusted by adjusting the springs 27 and 28 and means (not shown) for vertically moving the polishing unit 29 including members 17–28.

The ceramic substrate 4 is attached by vacuum suction on the x-y table 30 facing the pressure roller 17.

By such structure, the polishing tape 18 is gradually wound around the take-up roller 22 from the supply roller 19 by pressing the ceramic substrate 4 with the tape 18 via the pressure roller 17. Simultaneously, the pressure roller 17 is vibrated. The overall surface of the ceramic substrate 4 is processed by a process in which the x-y table 30 mounting the ceramic substrate 4 thereon is reciprocated by a predetermined number of times in X-direction, deviated a predetermined distance in Y-direction perpendicular to X-direction to be properly positioned and then reciprocated again in the X-direction.

Figure 7:
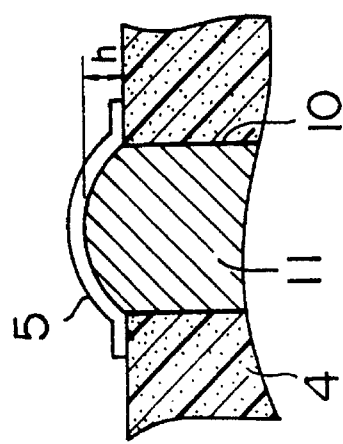
FIG. 7 is a cross-sectional view of a through hole conductor of a chip carrier in one embodiment of the present invention.

FIG. 7 is a fragmentary cross-sectional view of the substrate having a registration layer 5 of a conductive material such as aluminum formed by sputtering on the polished through hole conductor 11. The through hole conductor 11 is shaped so as to have a smooth or continuously convexly curved (crown-shaped) surface having a maximum height h measured from the surface of the substrate 4 at its center or in the vicinity of the center. Therefore, the registration layer 5 is attached firmly without having a spacing between the registration layer 5 and the through hole conductor 11.

Figure 8:
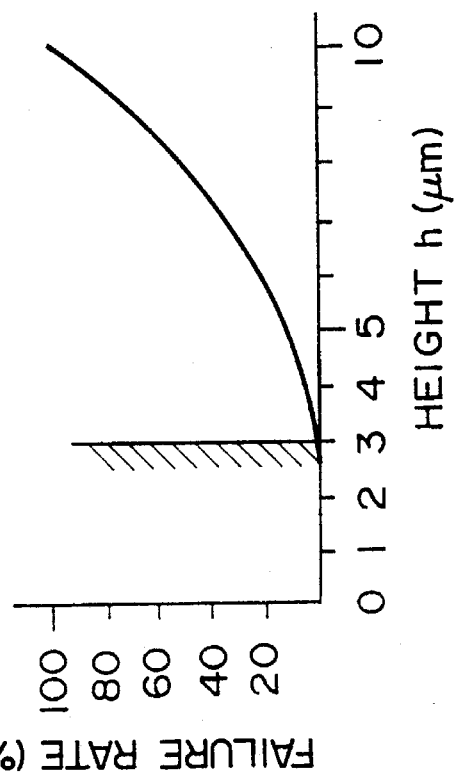
FIG. 8 is a diagram showing a relationship between the height of the protruding end of through hole conductors and the failure rate.

FIG. 8 shows the actually examined result indicative of the relationship between the failure rate of leadless carriers and the difference or the maximum height values h between the polished surfaces of the protruding ends of the conductors 11 and the surface of the ceramic substrate 4, as shown in FIG. 7. Thus, it will be seen that when the height is 3 μm or less, the failure rate is reduced to substantially zero. The failure rate is defined by (number of defective carriers/total number of examined carriers) ×100 (%). In this case, carriers in which short circuit or line breakage occurred were recognized as defective. Therefore, it will be seen that it is preferable to polish the surface of the extruding ends of the through hole conductors such that the height is 3 μm or less.

In the polishing apparatus shown in FIG. 6A, a rubber roller may be used as the pressure roller 17. In that case, the rubber hardness may be 20–50 degrees. The amplitude of vibrations of the pressure roller 17 may be 2–0.5 mm and the frequency may be 40–10 Hz.

Figure 9:
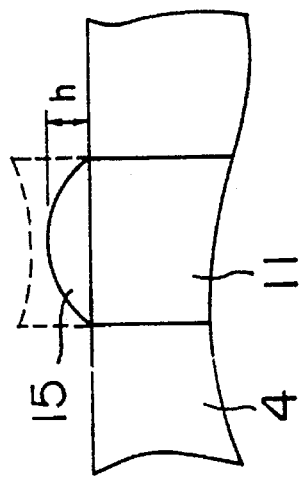
FIG. 9 is a cross-sectional view of a through hole conductor of a chip carrier in another embodiment of the present invention.

FIG. 9 illustrates another embodiment of the present invention in which the protruding ends of the through hole conductors 11 are made of a conductive material different from those in the through holes.

Figure 4:
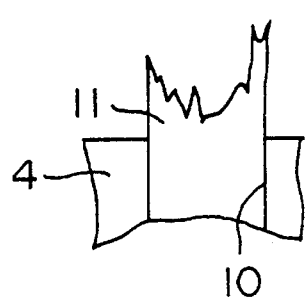
FIG. 4 is a cross-sectional view of a protruding end of the conventional through hole conductor.
Figure 5:
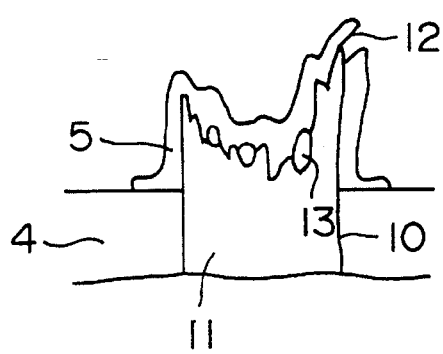
FIG. 5 is a cross-sectional view of the through hole conductor of FIG. 4 having a registration layer on its protruding end.

An electrically conductive paste of, for example, tungsten is used to fill therewith, by printing, one or more through holes 10 formed in the insulating substrate 4 made of, for example, a ceramic and the substrate 4 is then sintered. As a result, ends having discontinuously irregular, uneven surfaces and protruding from the surface of the substrate 4, as shown in FIG. 4, are produced. The protruding ends are ground by an apparatus, for example, shown in FIG. 6A such that the end surfaces of the through hole conductors 11 are substantially level with the surface of the substrate 4.

A conductor layer 15 is formed, for example by plating, on each of the ground end surfaces of the through hole conductors 11. The material for the conductor layer 15 may be, for example, nickel, gold or copper.

The plated layer 15 usually takes a concave form with its peripheral portions relatively thicker than the central portion, as shown by dotted lines in FIG. 9. The plated layer 15 is polished by the polishing process shown in FIG. 6A such that the plated layer 15 has a substantially continuously convexly curved surface with its maximum height measured from the surface of the substrate 4 at the center of the convex surface or in its vicinity.

Figure 1:
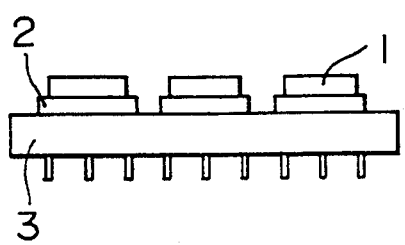
FIG. 1 is a side view of a module on which leadless semiconductor chip carriers are mounted.
Figure 2A:
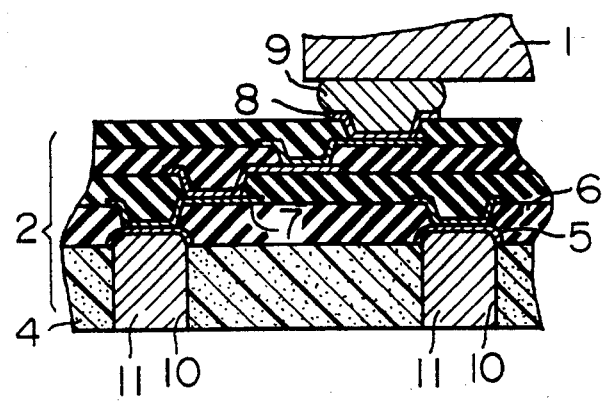
FIGS. 2A and 2B are cross-sectional and perspective, cross-sectional views of a leadless semiconductor chip carrier.
Figure 2B:
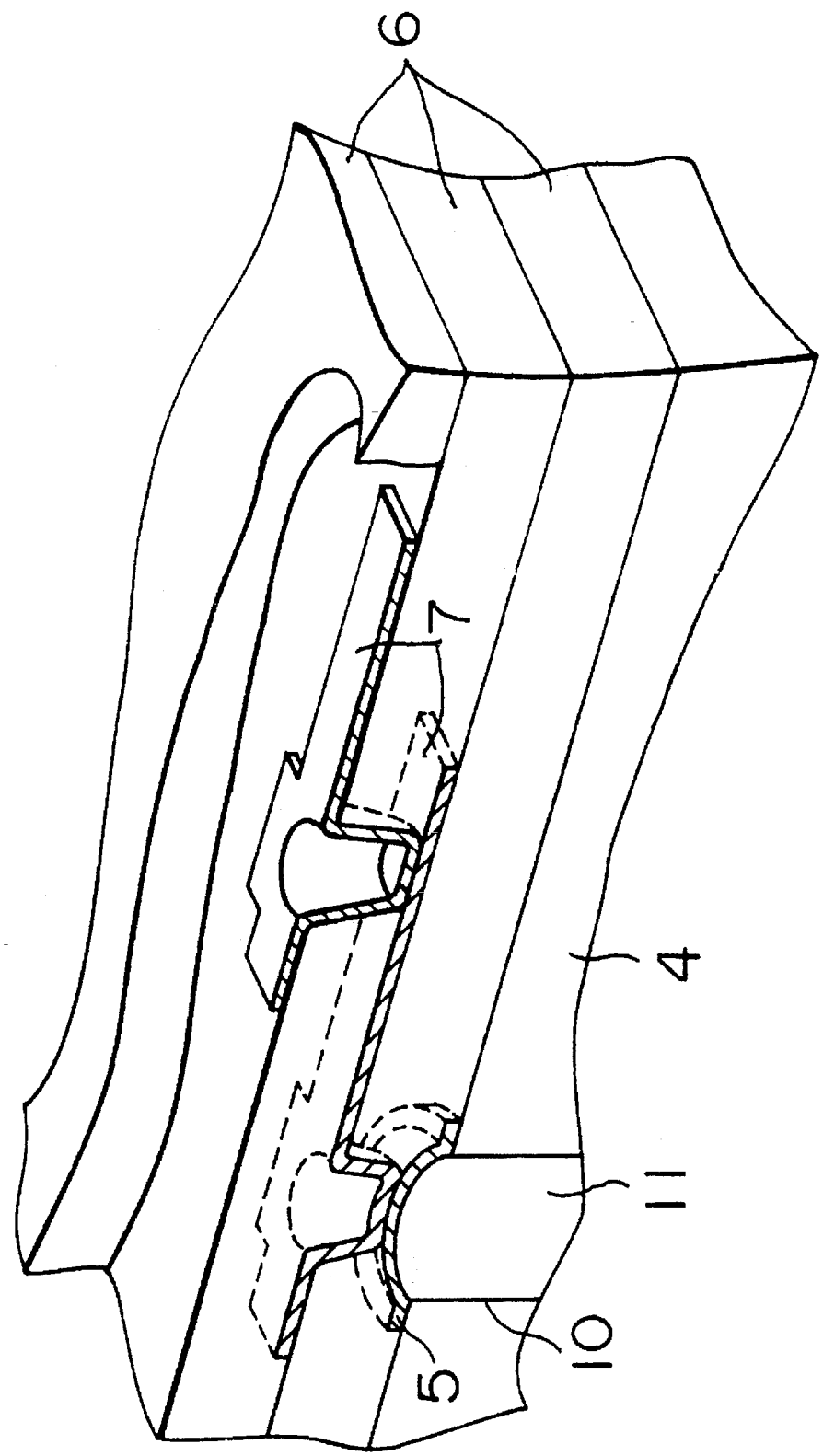

A registration layer similar to the registration layer 5 shown in FIG. 7 is formed on the polished surface of the plated layer 15. Further, a multilayer structure which includes a plurality of insulating layers 6 and a plurality of connection conductor layers 7 alternately laminated as shown in FIG. 2 is formed on the substrate on which the registration layer is provided.

In the present embodiment, the through hole conductor 11 is electrically connected to the registration layer 5 through a conductive layer 15 of a material which is joined to the registration layer stronger than the material of the conductor 11 is.

Figure 10:
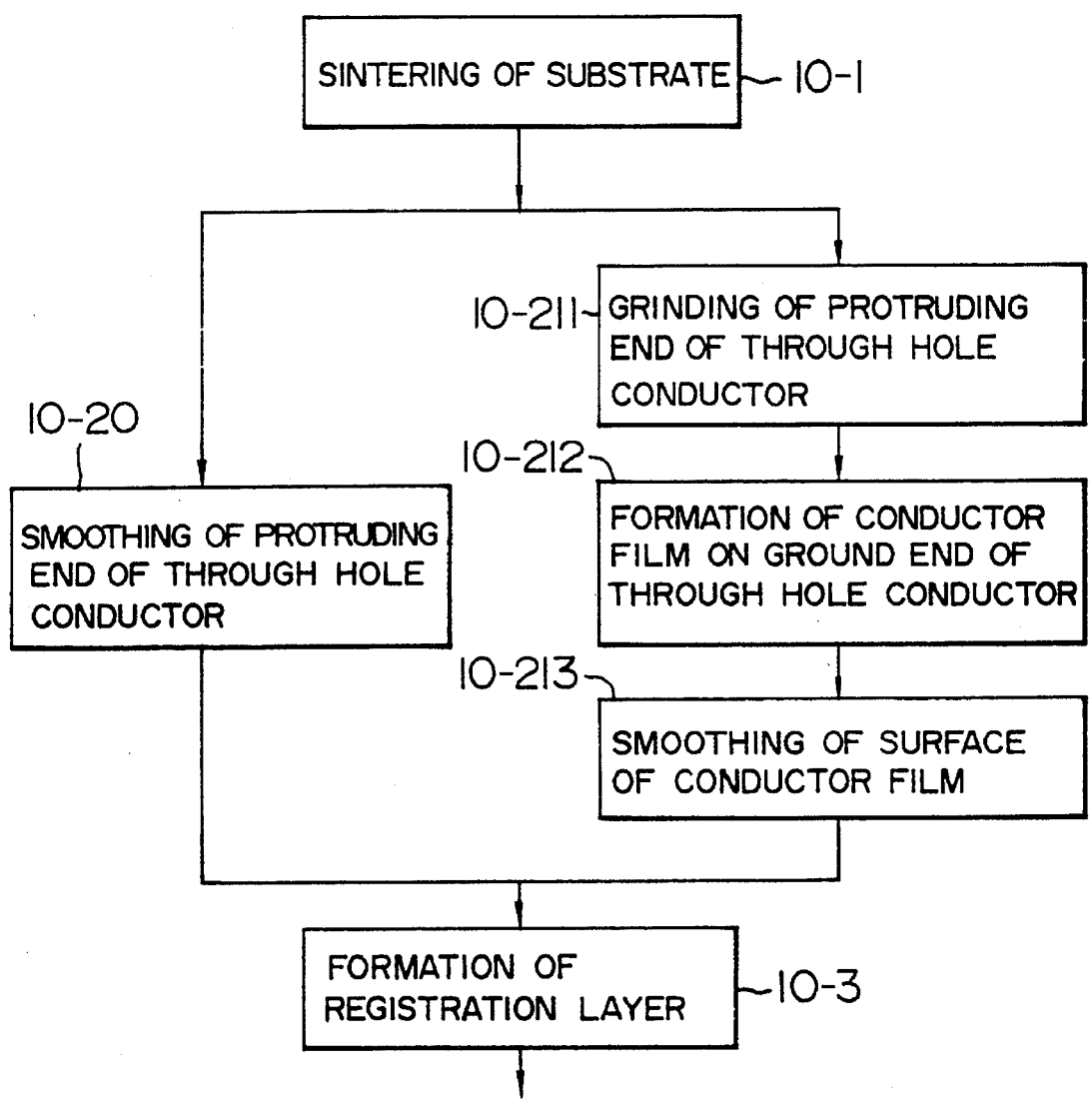
FIG. 10 shows a part of a process for manufacturing a chip carrier in one embodiment of the present invention.

FIG. 10 illustrates steps for processing the surface of the through hole conductor 11. A ceramic substrate 4 on which through hole conductors are provided, as mentioned above, is sintered (10-1), the surfaces of protruding ends of the conductors 11 are smoothed (10-20), and registration layers 5 are formed on the smoothed surfaces of the protruding ends (10-3). Preferably, the smoothed protruding ends of the conductors 11 should have height h not larger than 3 μm, as mentioned above.

Alternately, the substrate 4 is sintered (10-1), the protruding ends of the conductors 11 may be ground so as to be substantially level with the surface of the substrate (10-211), conductor layers 15 are formed by plating on the surfaces of the ground conductor ends (10-212), the surfaces of the conductor layers 15 are smoothed (10-213), and registration layers 5 are formed on the surfaces of the smoothed conductor layers 15 (10-3). Preferably, the smoothed conductor layers 15 should have a height h not larger than 3 µm, as mentioned above.

By carrying out the steps 3-3 to 3-5 of FIG. 3 subsequent to the step 10-3, chip carriers are completed.

It is confirmed that the relationship of the failure rate and the maximum values of the heights of the continuously convexly curved surfaces of the protruding ends of the through hole conductors shown in FIG. 8 measured from the surface of the substrate holds also in the embodiment of FIG. 9 where the protruding ends of the through hole conductors are made of a conductive material different from those of the through hole conductors.

According to the above embodiments, even if a ceramic substrate having a size of 100 mm×100 mm and having about 10,000 through holes 0.1 mm in diameter has a bend of about 100 µm, the surfaces of all the protruding ends of the through hole conductors are shaped so as to have continuously convexly curved surfaces mentioned above.

An example of a process of polishing a surface of a ceramic substrate using the polishing apparatus shown in FIG. 6A will now be described. The ceramic substrate has about 10,000 through holes filled with a paste mainly consisting of tungsten. The substrate has been subjected to a sintering treatment, a grinding treatment for making protruding ends of the through hole conductors substantially level with the surface of the substrate, and a plating treatment for plating the ground protruding conductor ends with nickel. The substrate to be polished has an area of 100×100 mm² and a thickness of about 1 mm. A polishing tape 18 used is coated with abrasive alumina grains having a grain size of 5 µm, a thickness of 25 µm and a width of 25 mm. The tape 18 is driven by a pressure roller 17 made of a rubber, having a diameter of 40 mm, a length of 25 mm and a rubber hardness of 45 degrees. The roller 17 presses the tape against the substrate 4 with a 10N load while feeding the tape 18 at a speed of 20 cm/min and applying vibrations to the rotational shaft of the pressure roller 17 with an amplitude of 0.7 mm and a frequency of 30 Hz such that the vibrations are perpendicular to the rotational shaft in a plane substantially parallel with the movable table 30. Under such condition, the movable table 30 on which the ceramic substrate 4 is mounted is reciprocated 8 times in the X-direction at a speed of 20 cm/min, and thereafter, the table 30 is moved 25 mm in the Y-direction perpendicular to the X-direction and is reciprocated 8 times in the X-direction in a similar manner. These steps are repeated to process the whole of the surface of the substrate 4. By this processing, the protruding ends (including plated layers) of the through hole conductors changed from 7 to 2 µm or less in height and from 2 to 0.1 µm or less in surface unevenness. As a result, the connection of the through hole conductors provided in the substrate to a conductive pattern of a multilayer structure provided on the substrate was greatly improved.

In the above embodiments, satisfactory leadless carriers for the computer module are obtained in spite of a bend in the ceramic substrate.

We claim:

1. A chip carrier comprising:

an electrically insulating substrate having at least one through hole formed therein;

a through hole electrical conductor of sintered powder provided in each of said through hole;

a plated metal layer formed on a surface of said through hole electrical conductor;

an electrically conductive sputtered layer formed on said metal layer and on a surface portion of said substrate surrounding said through hole;

a multilayer structure formed on said substrate, said multilayer structure having an electrical conductor pattern electrically connected with said electrically conductive layer; and wherein said plated metal layer protrudes to a height above the surface of said substrate which is not larger than 3 µm.

2. A chip carrier according to claim 1, wherein said electrically insulating substrate is formed of a ceramic.

3. A chip carrier comprising an electrically insulating substrate having at least one through hole formed therein;

a through hole electrical conductor of sintered powder provided in each of said through hole;

a plated metal layer formed on a surface of said through hole electrical conductor;

an electrically conductive sputtered layer formed on said metal layer and on a surface portion of said substrate surrounding said through hole;

a multilayer structure formed on said substrate, said multilayer structure having an electrical conductor pattern electrically connected with said electrically conductive layer, wherein said chip carrier is made according to a method wherein said through hole electrical conductor of sintered powder provided in each through hole of said electrically insulating substrate is formed by filling each through hole in the substrate with an electrically conductive material and sintering the substrate and electrically conductive material in the through hole so that an end portion of said electrically conductive material protrudes from a surface of said substrate and has a discontinuously irregular, uneven surface; grinding said end portion of said through hole conductor so that said through hole conductor is substantially leveled with said surface of said substrate to remove said discontinuously irregular, uneven surface; forming said plated metal layer on said ground end portion of said through hole conductor; and polishing said plated metal layer to form a generally continuously convexly curved surface.

\* \* \* \* \*